United States Patent [19]

Yu

[11] Patent Number: 5,436,480

[45] Date of Patent: Jul. 25, 1995

[54] INTEGRATED CIRCUIT INTERCONNECTION PROGRAMMABLE AND ERASABLE BY A PLURALITY OF INTERSECTING CONTROL TRACES

[76] Inventor: Shih-Chiang Yu, 10451 Davison Ave., Cupertino, Calif. 95014

[21] Appl. No.: 239,277

[22] Filed: May 6, 1994

Related U.S. Application Data

[63] Continuation of Ser. No. 20,604, Feb. 22, 1993, abandoned.

[51] Int. Cl.$^6$ ............... H01L 29/788; G11C 11/404; G11C 11/407
[52] U.S. Cl. ............... 257/321; 257/315; 365/185
[58] Field of Search ............... 257/314–321, 257/529, 530, 665; 365/104, 185, 186

[56] References Cited

U.S. PATENT DOCUMENTS

| | | |
|---|---|---|
| 4,573,144 | 2/1986 | Countryman, Jr. ............ 257/319 |
| 4,910,565 | 3/1990 | Masuoka ............ 357/23.5 |
| 4,967,393 | 10/1990 | Yokoyama ............ 365/185 |
| 4,988,635 | 1/1991 | Ajika ............ 437/43 |
| 4,989,053 | 1/1991 | Shelton ............ 257/321 |
| 4,989,054 | 1/1991 | Arima ............ 357/23.5 |
| 4,998,220 | 3/1991 | Eitan ............ 365/185 |
| 5,036,378 | 7/1991 | Lu ............ 357/23.5 |
| 5,053,841 | 10/1991 | Miyakawa ............ 357/23.5 |
| 5,235,200 | 8/1993 | Komori et al. ............ 257/315 |

FOREIGN PATENT DOCUMENTS

| | | | |
|---|---|---|---|
| 0456319 | 11/1991 | European Pat. Off. ............ 257/321 |
| 0104263 | 6/1982 | Japan ............ 257/319 |
| 0175437 | 9/1985 | Japan ............ 257/319 |
| 0194877 | 8/1986 | Japan ............ 257/321 |
| 0205665 | 9/1987 | Japan ............ 257/321 |

*Primary Examiner*—William Mintel
*Assistant Examiner*—Peter Toby Brown
*Attorney, Agent, or Firm*—Kam T. Tam

[57] ABSTRACT

A programmable interconnection of an integrated circuit including a floating gate having a portion thereof sandwiched in between a X-control trace and a Y-control trace. Another portion of the floating gate is dielectrically disposed atop the channel of a Metal Oxide Semiconductor Field Effect Transistor (MOSFET). Electrical charges are couplingly induced in the floating gate through the Fowler-Nordheim (F-N) tunneling effect when both the X-control and Y-control traces are simultaneously energized. When the X-control trace and the Y-control trace are deenergized, the charged floating gate couplingly vary the electrical conductivity of the underlying channel, allowing the programmable interconnection to be programmed to be at the "connect" or "disconnect" states. A plurality of such programmable interconnections can also be arranged in the semiconductor substrate in a matrix of rows and columns for the ease of addressing. During usage in the field, metal conductors of the integrated circuit can be programmed to be disconnected or connected through the programmable interconnections.

9 Claims, 3 Drawing Sheets

INTEGRATED CIRCUIT INTERCONNECTION PROGRAMMABLE AND ERASABLE BY A PLURALITY OF INTERSECTING CONTROL TRACES

This is a continuation of application Ser. No. 08/020,604, filed Feb. 22, 1993, now abandoned.

BACKGROUND OF THE INVENTION

1. Field of the Invention

The present invention relates to semiconductor devices. In particular, this invention is related to integrated circuits having programmable interconnections.

2. Description of the Related Art

Heretofore, various schemes have been used to implement the interconnections of programmable integrated circuits. Basically, the programmable elements used in these programmable integrated circuits are classified under two categories, namely, the destructively programmable type and the non-destructively programmable type.

Under the category of destructively programmable type, integrated circuits are rendered programmable through the use of fuses or anti-fuses. In the case of devices using fuses, the two terminal points of a basic programmable element are initially connected by a fuse during the fabrication process. Should the electrical connection of the two terminal points are not intended to be connected for a specific application, the fuse will be burnt by the user. In the case of devices using anti-fuses, a reverse scenario applies. Anti-fuses are essentially capacitor type devices. The two terminal points of a basic programmable element are initially fabricated without any electrical connections. The two terminal points are electrically bridged together after programming.

Under the category of non-destructively programmable type, the programmable integrated circuits are fabricated with elements that are re-programmable. An example of such an element is an enhancement type Metal Oxide Semiconductor Field Effect Transistor (MOSFET). When a supply voltage is applied to the gate of a MOSFET, a conductive channel is induced underneath the gate. The drain and source terminals are thereby electrically connected. Current can then be passed through the induced channel with minimal voltage potential drop across the source and drain terminals. When the supply voltage is removed, the channel underneath the gate basically disappears. The drain and source terminals are thus electrically disconnected, resulting in a state of disconnection for the programmable element. Another type of re-programmable logic element is exemplified by a MOSFET with a floating gate, such as a basic Electrical Erasable Programmable Read Only Memory (EEPROM) cell. The threshold voltage of an EEPROM cell may be programmed to assume a positive or negative value. For instance, a N-channel floating gate MOSFET can be programmed with a positive threshold voltage by trapping the floating gate with negative charges through the process of capacitive coupling, thereby inverting the underlying channel into a P-type semiconductor region and electrically disconnecting the source and the drain. The mechanism of trapping a specific charge for the floating gate from the underlying channel via the thin gate oxide is called Fowler-Nordheim (F-N) tunneling which is well known in the EEPROM technology. However, heretofore, integrated circuits with programmable interconnections using the aforementioned EEPROM cells involve very complicated sensing and decoding schemes, which render them expensive to manufacture.

SUMMARY OF THE INVENTION

The programmable interconnection of the present invention utilizes the F-N tunneling effect to charge or discharge a floating gate of a floating gate MOSFET, which enables the interconnection to be programmed or deprogrammed in a non-volatile fashion. A novel layout scheme of control lines allows the selection of the floating gate MOSFET to be programmed or deprogrammed with much less complexity.

According to the preferred embodiment of the present invention, there is provided a programmable interconnection comprising a floating gate MOSFET which includes a semiconductor substrate, a source and a drain formed on said substrate with a channel disposed therebetween. There is also thin tunnel gate oxide formed over the channel. The floating gate is disposed atop said gate oxide. A plurality of the programmable interconnections are formed on the semiconductor substrate in a matrix format. Individual floating gate MOSFETs are separated from each other by a field oxide layer. Control gate lines in both the X-direction and the Y-direction are also formed on the semiconductor substrate insulated from each other with insulated layers. The floating gate of each of the floating gate MOSFET is dielectrically disposed in between the X-control gate line and the Y-control gate line such that the F-N tunneling effect can occur only when both the control gate lines are energized. With this arrangement, each of the programmable interconnection in the matrix can be selectively programmed or de-programmed with relatively few number of control gate lines.

Programmable Interconnections of the present invention can also be used in integrated circuits with a multi-metal layer structure for additional connectivity.

Further objects and features of the present invention will become apparent in the following description with reference to the accompany drawings and the claims which follows.

DESCRIPTION OF THE DRAWINGS

FIG. 1b is a cross-sectional side view of the programmable interconnection taken along line 1b—1b of FIG. 1a.

FIG. 1c is a cross-sectional side view of the programmable interconnection taken along line 1c—1c of FIG. 1a.

FIG. 2d is a cross-sectional side view of the programmable interconnection taken along line 1d—1d of FIG. 1a.

DETAILED DESCRIPTION OF THE INVENTION

Figure 1A:
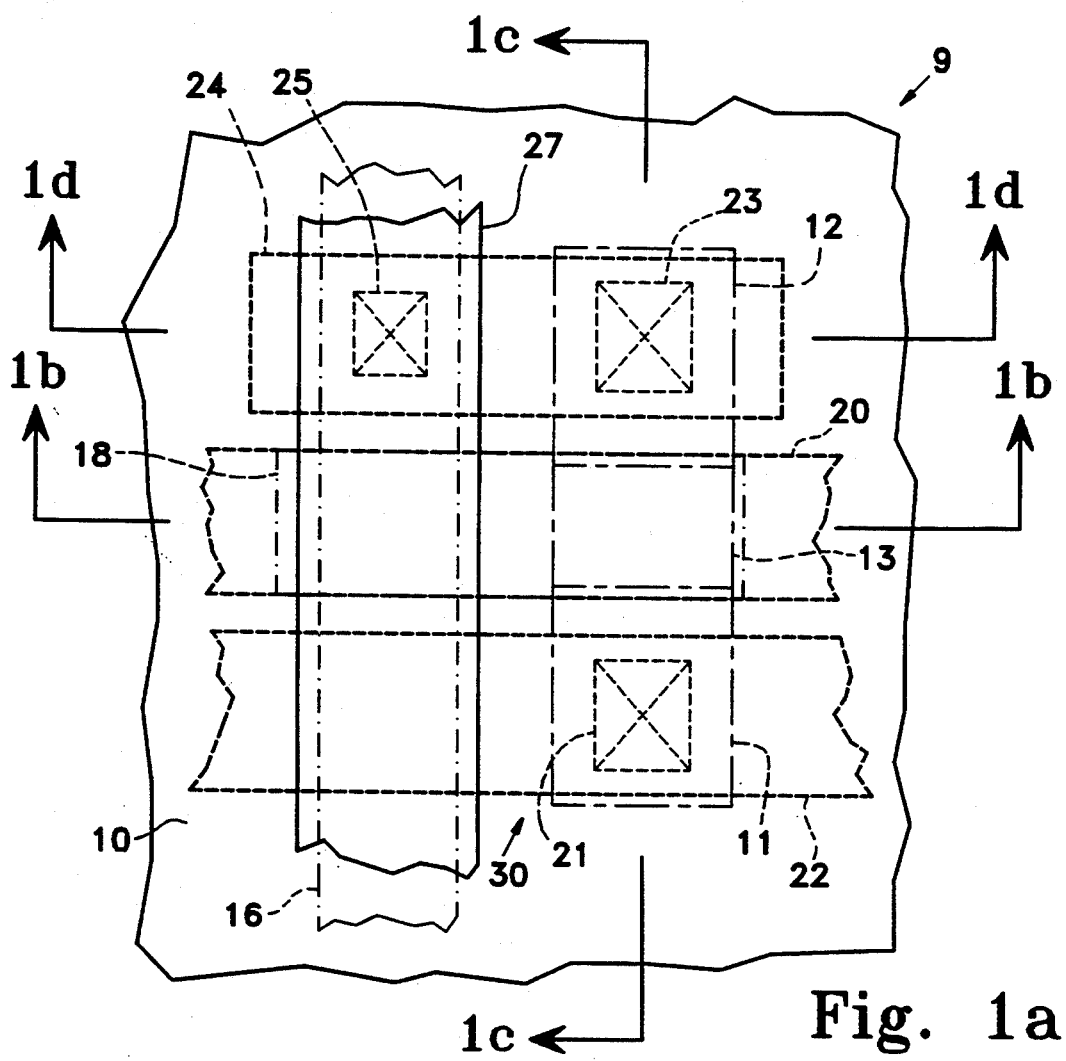
FIG. 1a is a top plan view showing the layout of the programmable interconnection of the present invention.
Figure 1B:
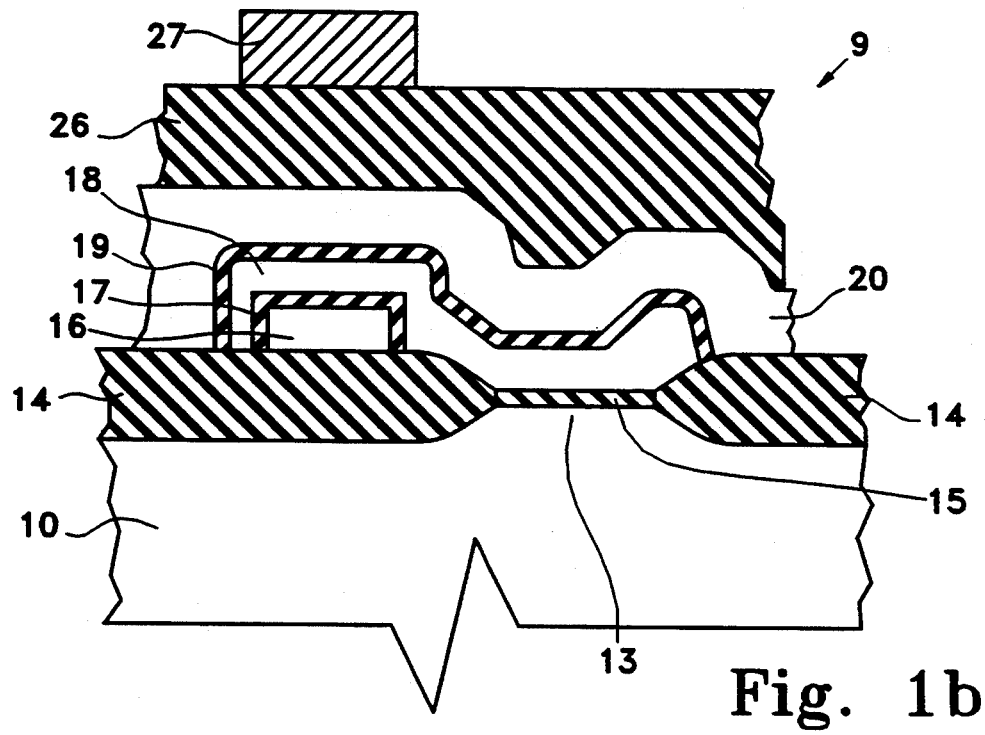
Figure 1C:
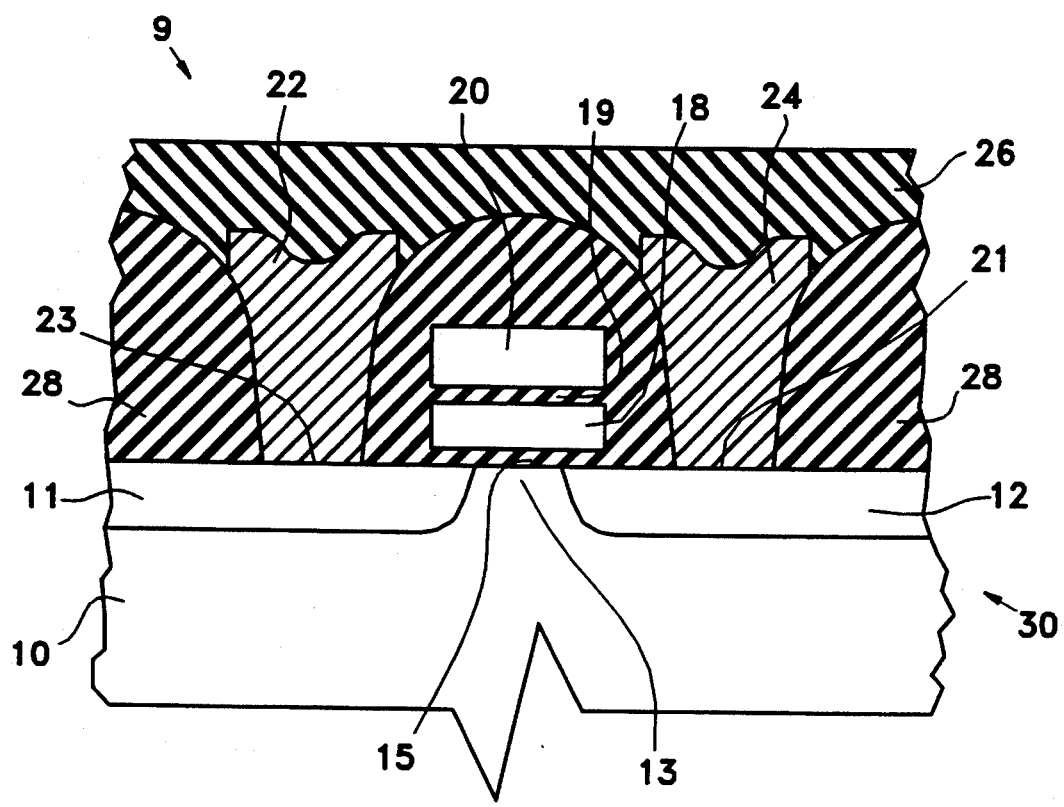
Figure 1D:
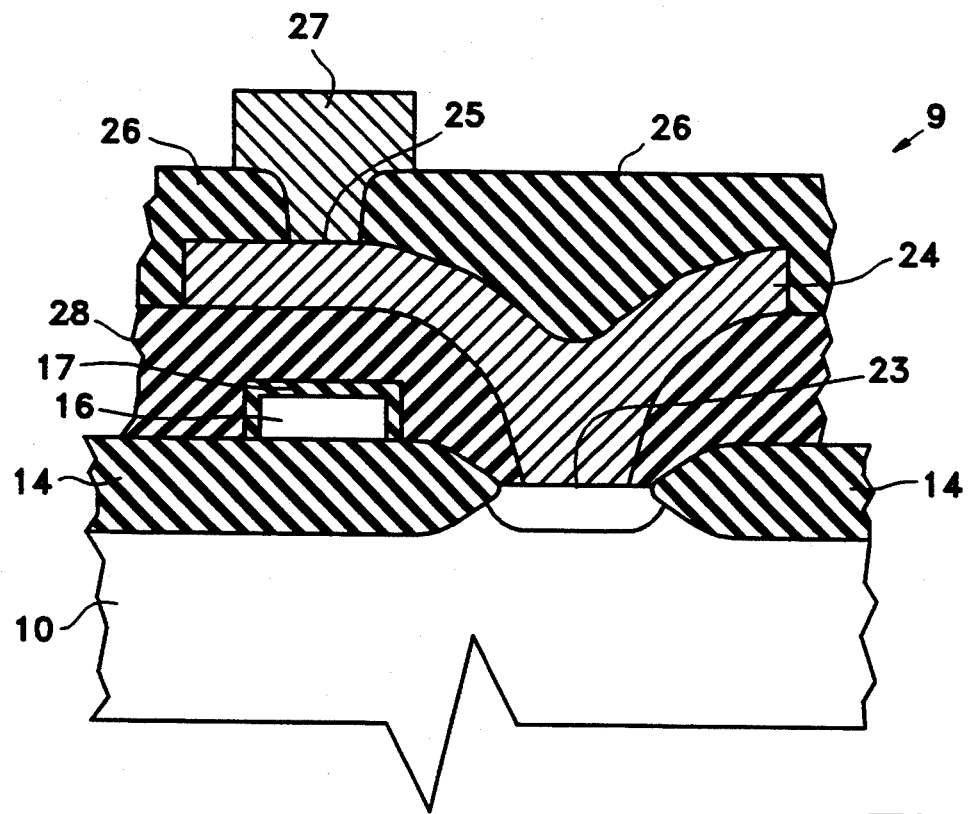
Figure 2:
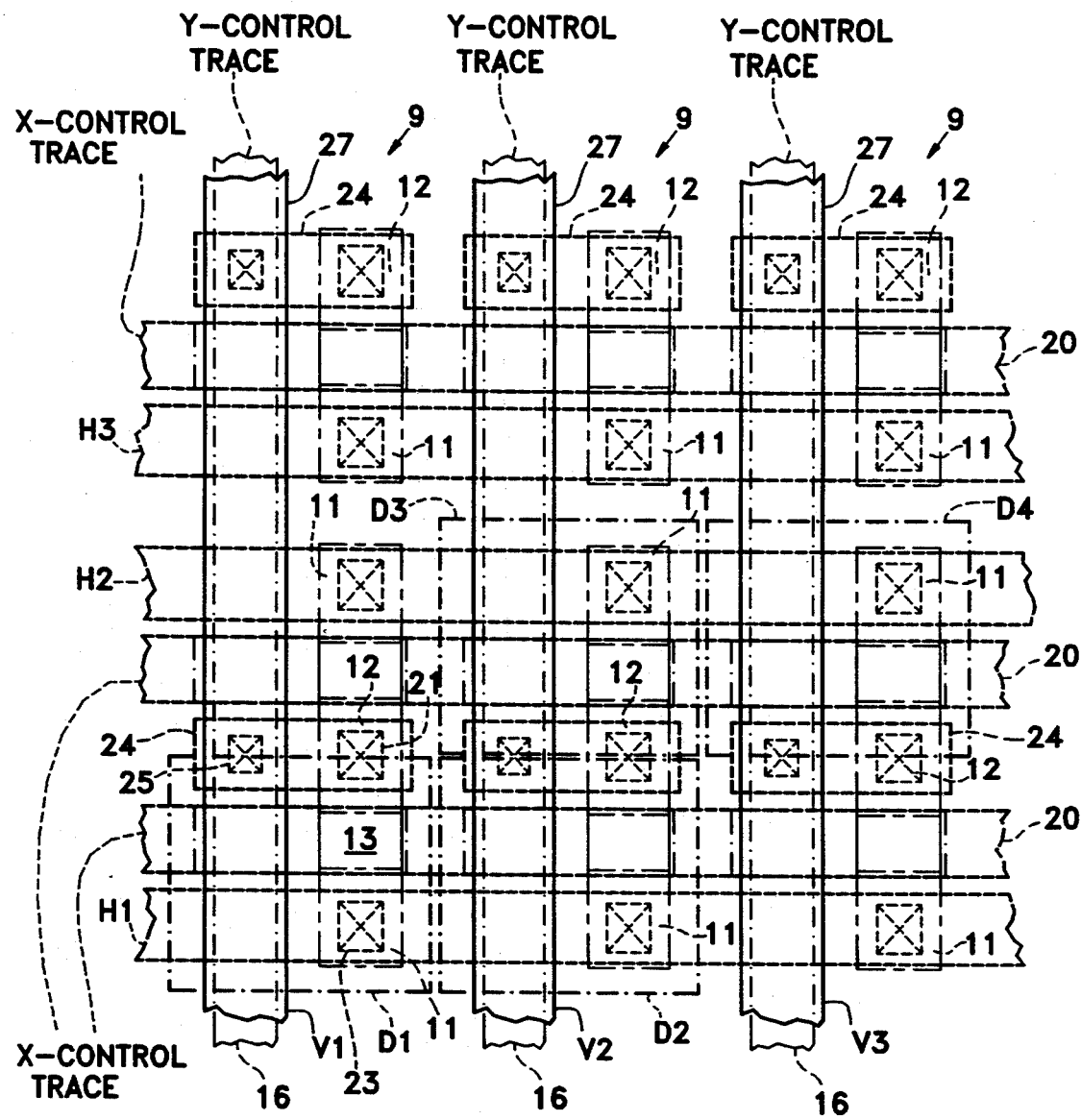
FIG. 2 is a top plan view of a portion of an integrated circuit having a plurality of programmable interconnections arranged in a matrix format.

A preferred embodiment according to the present invention is described with reference to the accompanying drawings. FIG. 1a is a plan view showing the layout of the present invention. FIG. 1b, FIG. 1c, and FIG. 1d are cross-sectional side views taken along lines 1b—1b, 1c—1c, and 1d—1d, respectively, of FIG. 1a. The programmable interconnection is generally designated by reference numeral 9. In this embodiment, formed in a P-type semiconductor substrate 10, is a N-type source 11 and drain 12. Formed between source 11 and drain 12 is a channel 13. Devices are isolated from each other by a field oxide layer 14. There is also a thin tunnel gate oxide 15 deposited over the channel 13 on the surface of semiconductor substrate 10. Information can be written into or read from programmable interconnection 9 through a matrix of control lines as shown in FIG. 2. The details of the reading and writing mechanism will be explained later in this specification. A Y-control trace 16 of polysilicon is formed on field oxide layer 14. Above Y-control trace 16 and dielectrically separated therefrom is a portion of floating gate 18 shown in FIG. 1b. Another portion of floating gate 18 is disposed on the top of thin tunnel gate oxide 15. Elongated X-control trace 20 dielectrically separated from floating gate 18, is also partially formed on portions of field oxide layer 14. X-control trace 20, Y-control trace 16, and floating gate 18 are separated by insulations 17 and 19, respectively. In the preferred embodiment, insulations 17 and 19 are made of oxide-nitride-oxide, and silicon dioxide, respectively. X-control trace 20, Y-control trace 16, and floating gate 18 are made of polysilicon. Alternatively, polysilicon can be substituted with other materials such as refractory silicide or metal. First metal conductor 24 overlying a first field insulation layer, such as insulation 28, is connected to drain 12 through a drain contact 21. Similarly, second metal conductor 22 overlying field oxide layer 28 is connected to the source 11 through a source contact 23. First metal conductor 24 and second metal conductor 22 are preferably designed in the primary metal layer which is the metal layer closest to the surface of semiconductor substrate 10 in a multi-metal layer structure. With the arrangement as described, a floating gate MOSFET 30 is formed in which floating gate 18 can be programmed to be positively or negatively charged through the simultaneous application of appropriate voltages on both the X-control trace 20 and Y-control trace 16.

As was mentioned earlier, in a multi-layer metal system, a secondary metal layer can be laid on the top of the primary metal layer, with the metal layers separated from each other by insulation layers and communicating with each other through contact openings such as vias. As shown in FIGS. 1a–1d, third metal conductor 27 in the secondary metal layer isolates from first and second metal conductors 24 and 22 in the primary metal layer by an insulation layer 26. Third metal conductor 27 electrically communicates with first metal conductor 24 through via 25.

Programmable interconnection 9 is a programmable device in which information can be written into or read from in a non-volatile fashion, as to differentiate from a volatile device such as a RAM cell in which information is lost when voltage applied to the cell is terminated.

Information can be written into or read from floating gate MOSFET 30 in the form of "ON" or "OFF" states, which correspond to the respective "connect" and "disconnect" states of programmable interconnection 9. For floating gate MOSFET 30 to be at the "ON" state, channel 13 must be rendered conductive. This can be achieved by programming, or writing, floating gate MOSFETs 20 with a threshold voltage of about −3 Volts. To accomplish this end, a −20 Volts voltage is applied to both X-control trace 20 and Y-control trace 16 such that the voltage of floating gate 18, through the process of capacitive coupling, and with a coupling efficiency of approximately 35% for each of the control traces, attains a voltage level of about −14 Volts. The −14 Volts voltage at floating gate 18 is sufficient to cause significant F-N tunneling of electrons from floating gate 18 through thin gate oxide 15 and into channel 13. Upon the removal of the −20 Volts voltage on both the X-control trace 20 and the Y-control trace 16, electrons are trapped outside of floating gate 18, resulting in floating gate 18 being induced with positive charges. The positively charged floating gate 18 attracts electrons on the opposite side of thin gate oxide 15 which inverts channel 13 into a N-type semiconductor region, and renders floating gate MOSFET 30 to be at the electrically "ON" state. As a consequence, programmable interconnection 9 is at the "connect" state which allows first metal conductor 24 to electrically connect with second metal conductor 22.

Similarly, to de-program floating MOSFET 30, the aforementioned process is repeated with the opposite voltage polarity. Specifically, a +20 Volts voltage to both the Y-control trace 16 and the X-control trace 20 is applied such that floating gate voltage through the process of capacitive coupling and with a coupling efficiency of 35% for each of the control traces, will attain a voltage of +14 Volts. The +14 Volts voltage at floating gate 18 attracts electrons from the underlying channel 13 through the gate oxide 15, due to the F-N tunneling effect. Upon the removal of the +20 Volts voltage from both the X-control trace and the Y-control trace, floating gate 18 is induced with negative charges of trapped electrons. The negatively charged floating gate 18 couplingly repels and depletes electrons in the underlying channel 13 and turns it into a P-type semiconductor region which electrically separates drain 12 and source 11.

An integrated circuit with programmable interconnections 9 can be built with a plurality of floating gate MOSFETs 30 arranged in a matrix format of rows and columns and with associated control lines. X-control traces 20 of each of programmable interconnection 9 in the same row are electrically joined together. Similarly, Y-control traces 16 of each of programmable interconnections 9 in the same column are electrically tied together. X-control trace 20 and Y-control trace 16 are dielectrically insulated from and intersecting each other on the surface of semiconductor substrate 10. Metal conductors in the first and secondary metal layers communicate with each other through contact vias. As is clearly shown in FIG. 2, elongated third metal conductors 27 in the secondary metal layer electrically communicate with drains 12 of programmable interconnections 9 in the same column through contact vias 25, first metal conductors 24 in the primary metal layer and vias 21 respectively. Any metal conductors in the secondary metal layer, such as third metal conductors 27 can electrically communicate with any of the metal conductors in the primary metal layer, such as first metal conductors 24 and second metal conductors 22, through floating MOSFET 30, depending on the "ON" state or "OFF" state of floating gate MOSFET 30. For example, FIG. 2 shows a top plan view of a layout of an integrated circuit having nine programmable interconnections arranged in a matrix format of three rows by three columns. Any one of the programmable integrated interconnections 9 can be programmed or deprogrammed as was previously described. However, the programming process must be conducted under a somewhat simultaneous application of −20 Volts on both the X-control line 20 and the Y-control line 16. With only one control trace being energized to −20 Volts, floating gate 18 can only attain a voltage level of approximately −7 Volts with a coupling efficiency of 35% which is insufficient to cause any F-N tunneling of electrons. Similarly, the deprogramming process can be accomplished only if both the X-control trace 20 and the Y-control trace 16 are simultaneously energized to +20 Volts. Floating gate MOSFETs under only the energized X-control trace 20, or the energized Y-control trace 16, but not both, does not attain sufficient voltage level to cause any F-N tunneling effect. As a consequence, they retain their previous "ON" or "OFF" state.

With the aforementioned feature, any metal conductors, irrespective of its existence in the primary metal layer or other metal layers, can be selectively programmed to link together or to separate from each other. A few examples with reference to FIG. 2 will serve as an illustration.

In FIG. 2, certain parts assume specifically designated letters for the sake of clarity in illustration. When programmable interconnection D1 is programmed to be conductive, then metal conductors V1 and H1 are electrically connected together. Specifically, conductors V1 and H1 are electrically connected through via 25, first metal conductor 24, contact 21, source 12, channel 13, drain 11, and contact 23, respectively. In another example, programmable interconnections D2 and D3 are programmed to be conductive. In this case, conductors H1 and H2 are electrically connected together. In yet another example, suppose programmable interconnection D3 and D4 are programmed to be conductive, then conductors V2 and V3 are electrically connected together through conductor HI. To disconnect the metal conductors, the aforementioned steps with +20 Volts substituting the −20 Volts applied voltage can be repeated. In a multi-layer metal semiconductor structure with three metal layers and beyond, the principle of the programmable interconnection still applies.

The fabrication method of the integrated circuit with programmable interconnections is herein described with references to the accompanying FIGS. 1a–1d and FIG. 2.

Processing steps relating to the fabrication of a MOSFET is well known in the art and is not described in detail in here. The building of programmable interconnection 9 starts with a semiconductor substrate 10. For example, in this embodiment, substrate 10 is a P-type substrate. After the growth of a buffer layer of 50 nanometers of oxide on the semiconductor substrate 10, a nitride layer of approximately 150 nanometers is then deposited. Unwanted nitride in selected areas on the semiconductor substrate 10 is etched away through the conventional masking and etching steps. Field oxide layer 14 of approximately 1.2 micrometers in thickness is then grown on the top of semiconductor substrate 10. The remaining nitride layer over gate regions 15 is stripped away by hot phosphoric acid to expose the active area where the channel 13 will eventually reside. What follows is the deposition of 450 nanometers of polysilicon having a resistance of 6 Ohms atop substrate 10. The conventional masking and etching steps are then employed to define Y-control trace 16. An oxide-nitrite-oxide insulation layer 17 of 30 nanometers in thickness is then deposited over Y-control trace 16. Conventional masking and etching steps are again employed to strip away unwanted portions of insulation layer 17 and to define the proper pattern for the Y-control trace 16. With the area above channel region 13 cleared through selective etching, a thin tunnel oxide 15 of 11 nanometers is thermally grown. Another layer of polysilicon with a thickness of 250 nanometers and a resistance of 6 Ohms is then deposited. Masking and etching steps are again used to form the floating gates 18. An oxidation step is performed on floating gate 18 to form insulations 19. Thickness of insulation 19 in the preferred embodiment is 50 nanometers. Afterwards, an additional layer of polysilicon with 450 nanometers in thickness and a resistance of 4 Ohms is further deposited on the top of the resultant substrate 10 to form X-control trace 20. The desired pattern of X-control trace 20 is available through the conventional masking and etching steps. Using floating gates 19 as self-aligned masks. N-type dopant such as arsenic is then implanted in semiconductor substrate 10 to form drain 12 and source 11. A one micrometer insulation layer is then deposited and densified, followed again by conventional masking and etching steps to open vias 21 and 23 for source 12 and drain 11. A primary metal layer of 1 micrometer in thickness is then deposited on the resultant substrate 10. Desired pattern of the primary metal layer is available through the suitable steps of masking and etching. In a dual-layer metal structure, a secondary metal layer of 1 micrometer can also be deposited, after the deposition of the inter-metal dielectric layer with contact openings formed therein. Multi-metal layer structure can be fabricated in a similar fashion.

The above description of preferred embodiments of the present invention has been provided for the purpose of illustration and explanation. It is not to be construed in a limiting sense. Various modifications of the preferred embodiments will be obvious to persons skilled in the art. Those modifications and variations of preferred embodiments are considered in the scope of the invention that is to be defined by the following claims and their equivalents.

What is claimed is:

1. A programmable interconnection of an electronic circuit comprising:
   a semiconductor substrate of a first conductivity type;
   a source and a drain of a second conductivity type, formed in said semiconductor substrate at a spaced apart relationship;
   a channel formed between said source and said drain;
   a first field insulation layer having a first opening and a second opening formed therethrough, disposed above said semiconductor substrate and;
   a thin tunnel oxide layer disposed atop said channel;
   an elongated X-control trace disposed above said first field insulation layer and said thin tunnel oxide and substantially perpendicular to the direction from said source to said drain;
   an elongated Y-control trace disposed above said first field insulation layer and substantially parallel to the direction from said source to said drain;
   a floating gate disposed between said X-control trace and said Y-control trace, and further disposed above said thin tunnel oxide;
   a first metal conductor disposed above said first field insulation layer; said first metal conductor being in electrical communication with said drain through said first opening; and a second metal conductor disposed above said first field insulation layer, said second metal conductor being in electrical communication with said source through said second opening;

whereby when electrical voltage is applied to said X-control and said Y-control traces, electrical charges are couplingly induced in said floating gate, allowing said floating gate to couplingly vary the electrical conductivity of said channel through said thin tunnel oxide after the removal of the electrical voltage, thereby enabling said programmable interconnection to be electrically programmable.

2. The programmable interconnection as set forth in claim 1 further comprising:

a second field insulation layer having contact openings therethrough, disposed above said first and second metal conductors; and a third metal conductor disposed above said second field insulation layer, said third metal conductor being in electrical communication with one of said first and said second metal conductors through one of said contact openings.

3. An electronic circuit formed on a semiconductor substrate including a plurality of programmable interconnections, each of said programmable interconnections comprising:

a source and a drain in the semiconductor substrate at a spaced apart relationship;

a channel formed between said source and said drain;

a field insulation layer having a first opening and a second opening formed therethrough, disposed above said semiconductor substrate;

a thin tunnel oxide layer disposed atop said channel;

an elongated X-control trace disposed above said field insulation layer and said thin tunnel oxide and substantially perpendicular to the direction from said source to said drain;

an elongated Y-control trace disposed above said field insulation layer and substantially parallel to the direction from said source to said drain;

a floating gate disposed between said X-control trace and said Y-control trace, and further disposed above said thin tunnel oxide;

a first metal conductor disposed above said field insulation layer, said first metal conductor being in electrical communication with said drain through said first opening; and a second metal conductor disposed above said field insulation layer, said second metal conductor being in electrical communication with said source through said second opening;

wherein said plurality of programmable interconnections being disposed in the semiconductor substrate in a matrix of rows and columns with each X-control trace in each of said rows of said matrix being electrically connected together, and with each Y-control trace in each of said columns of said matrix being electrically connected together, thereby allowing each of said programmable interconnections to be selectively programmed when electrical voltage is substantially simultaneously applied to the selected X-control and Y-control traces.

4. The programmable connection as set forth in claim 3 wherein said X-control trace, said Y-control trace, and said floating gate are made of a material selected from a group consisting of polysilicon, refractory silicide, and metal.

5. A programmable interconnection of an electronic circuit comprising:

a semiconductor substrate;

a source and a drain formed in said semiconductor substrate at a spaced apart relationship;

a channel formed between said source and said drain;

a tunnel oxide layer disposed atop said channel;

an elongated first control trace disposed above said semiconductor substrate substantially perpendicular to the direction from said source to said drain;

an elongated second control trace disposed above said semiconductor substrate substantially parallel to the direction from said source to said drain, said elongated second control trace intersecting said first control trace and insulated therefrom;

a first field insulation layer disposed above the surface of said semiconductor substrate said Y-control trace being disposed atop said field insulation layer; and a floating gate having a first portion thereof disposed above said channel, and a second portion thereof disposed between said first control trace and said second control trace, such that when both said first and second control traces are energized, electrical charges are couplingly induced in said floating gate, allowing said floating gate to couplingly vary the electrical conductivity of said channel after said control traces are de-energized, thereby enabling said interconnection to be electrically programmable.

6. The programmable interconnection as set forth in claim 5 wherein said first field insulation layer comprises a first opening and a second opening, and wherein said programmable interconnection further comprising:

a first metal conductor disposed above said first field insulation layer, said first metal conductor being in electrical communication with said drain through said first opening; and a second metal conductor disposed above said first field insulation layer, said second metal conductor being in electrical communication with said source through said second opening.

7. The programmable interconnection as set forth in claim 6 further comprising:

a second field insulation layer having contact openings therethrough, disposed above said first and second metal conductors; and a third metal conductor disposed above said second field insulation layer and in electrical communication with one of said first and second metal conductors through one of said contact openings.

8. The programmable interconnection as set forth in claim 5 wherein said first control trace, said second control trace, and said floating gate comprise polysilicon.

9. An electronic circuit formed on a semiconductor substrate including a plurality of programmable interconnections, each of said programmable interconnections comprising:

a source and a drain formed in the semiconductor substrate at a spaced apart relationship;

a channel formed between said source and said drain;

a tunnel oxide layer disposed atop said channel;

an elongated first control trace disposed above the semiconductor substrate substantially perpendicular to the direction from said source to said drain;

an elongated second control trace disposed above the semiconductor substrate substantially parallel to the direction from said source to said drain, said elongated first control trace intersecting said second control trace and insulated therefrom;

a field insulation layer disposed above the surface of said semiconductor substrate; and a floating gate having a first portion thereof disposed above said channel, and a second portion thereof disposed between said first control trace and said second control trace;

wherein said plurality of programmable interconnections being disposed in the semiconductor substrate in a matrix of rows and columns with each first control trace in each of said rows of said matrix being electrically connected together and with each said second control trace in each of said columns of said matrix being electrically connected together, thereby allowing each of said programmable interconnections to be selectively programmed when said selected first control and second control traces are substantially simultaneously energized.

* * * * *